United States Patent [19]

Lünter

[11] Patent Number: 5,487,177
[45] Date of Patent: Jan. 23, 1996

[54] FM RECEIVER COMPRISING A CIRCUIT ARRANGEMENT FOR DETERMINING THE FIELD STRENGTH OF FM TRANSMITTERS

[75] Inventor: Heinz Lünter, Kinzenbach, Germany

[73] Assignee: U.S. Philips Corporation, New York, N.Y.

[21] Appl. No.: 96,077

[22] Filed: Jul. 22, 1993

[30] Foreign Application Priority Data

Aug. 8, 1992 [DE] Germany .......................... 42 26 346.8

[51] Int. Cl.⁶ ............................................. H04B 17/00
[52] U.S. Cl. ................... 455/67.3; 455/67.1; 455/226.1; 455/312
[58] Field of Search .......................... 455/161.1, 161.2, 455/161.3, 226.1, 226.2, 226.367.1, 67.3, 308, 309, 185.1, 186.1, 296, 312, 222, 42, 77, 205; 327/336, 344

[56] References Cited

U.S. PATENT DOCUMENTS

| | | | |
|---|---|---|---|
| 3,979,679 | 9/1976 | Bush et al. ............................... | 455/222 |
| 4,203,072 | 5/1980 | Beningfield et al. .................... | 455/312 |
| 4,388,731 | 6/1983 | King ....................................... | 455/312 |
| 4,881,273 | 11/1989 | Koyama et al. ....................... | 455/161.1 |
| 4,989,263 | 1/1991 | Suzuki ................................... | 455/226.2 |
| 5,125,105 | 6/1992 | Kennedy et al. ...................... | 455/226.2 |
| 5,199,109 | 3/1993 | Baker ..................................... | 455/161.2 |
| 5,222,254 | 6/1993 | Verron et al. .......................... | 455/186.1 |

FOREIGN PATENT DOCUMENTS

| | | | |
|---|---|---|---|
| 0245823 | 11/1987 | European Pat. Off. ............ | 455/161.3 |
| 2629404 | 1/1977 | Germany . | |
| 3130341 | 6/1982 | Germany . | |

Primary Examiner—Reinhard J. Eisenzopf
Assistant Examiner—Nguyen Vo
Attorney, Agent, or Firm—Bernard Franzblau

[57] ABSTRACT

An FM reciever which provides a rapid determination of the field strength of FM transmitters has a circuit arrangement which includes an FM demodulator and is characterized in that the output signal of the FM demodulator is applied to a comparator which, in response, produces an output signal that will assume a low or a high amplitude. The comparator precedes an integrator stage whose output signal has a high amplitude only when the output signal of the FM demodulator is suitable for field strength evaluation.

8 Claims, 1 Drawing Sheet

FM RECEIVER COMPRISING A CIRCUIT ARRANGEMENT FOR DETERMINING THE FIELD STRENGTH OF FM TRANSMITTERS

BACKGROUND OF THE INVENTION

This invention relates to an FM receiver comprising a circuit arrangement for determining the field strength of FM transmitters, including an FM demodulator, particularly to an FM receiver evaluating the Radio Data System signals.

A problem in such receivers is that the quality, i.e. particularly the field strength of other transmitters is to be checked during reception of signals from a first transmitter. The reception of the first transmitter should of course be interrupted for a short time such that this interruption is not audible in the ideal case. This particularly occurs in receivers evaluating the RDS signals transmitted by most FM transmitters. These RDS signals carry information with regard to eventual alternative frequencies, i.e. other FM transmitters than the one upon which the receiver is actually tuned (hereinafter referred to as actual transmitter) which transmit the same program as the actual transmitter, but at different frequencies, and upon which tuning may be changed over to when the reception quality, i.e. particularly the field strength of the actual transmitter, gets too bad.

In addition to the time necessary for evaluating, the FM receiver requires a given period of time for the short-time change-over or frequency jump to an alternative FM transmitter frequency, the length of this period of time being dependent on the value of the frequency difference between the actual transmitter and an alternative transmitter whose field strength is to be checked. However, since this frequency difference is not always known or utilized, it will be necessary to start in any case from the maximum frequency jump so that the waiting time elapsing between the frequency setting of the transmitter to be checked and the possible evaluation of its field strength should always be the same as if a large frequency jump had taken place. This means that this waiting time is always relatively long.

SUMMARY OF THE INVENTION

It is an object of the invention to provide a circuit arrangement obviating this problem and which makes it possible to provide a rapid evaluation of the field strength of an FM transmitter to be checked.

According to the invention, this object is achieved in that the output signal of the FM demodulator is applied to a comparator whose output signal may assume a low or a high amplitude, said comparator preceding an integrator stage the output signal thereof activating at a given amplitude level a field strength evaluation when the output signal of the FM demodulator is suitable therefor.

The output signal of the FM demodulator is thus compared with a constant signal in a comparator so that the comparator supplies an activation output signal e.g. a high amplitude, when the amplitude of the output signal of the FM demodulator is above that of the comparison signal. When the amplitude of the output signal of the FM demodulator is below the amplitude of the comparison signal, the comparator supplies an output signal having a low amplitude.

In order to switch off voltage peaks which still occur in this output signal during the tuning process, these voltage peaks causing the output signal to assume the high amplitude for short periods of time, the comparator precedes an integrator stage which smooths the output signal of the comparator so that the amplitude of the output signal of the integrator stage directly indicates when the amplitude of the output signal of the FM demodulator is proportional to the field strength of an alternative FM transmitter to which the FM receiver has been briefly tuned. The output signal of the integrator stage thus quasi-indicates when the FM receiver tuning has locked on to the alternative FM transmitter frequency and when the output signal of the FM demodulator has responded and can be used for field strength evaluation.

An advantage of this circuit arrangement is that the field strength of a new FM transmitter can be measured after a minimum possible period of time subsequent to tuning to this new FM transmitter. Conventionally only in the case of small frequency jumps would the output signal of the integrator very rapidly signal a valid output signal of the FM demodulator so that the field strength could be evaluated very rapidly. In practice, particularly in RIDS receivers, a considerably shorter waiting time, which is required during the period when the field strength of alternative FM transmitters is being checked, can be achieved because it is no longer necessary to start from a maximum frequency jump, but instead to it is only necessary to utilize only that waiting time which is required for the actual frequency jump.

In one embodiment of the invention a microprocessor is provided for the purpose of field strength evaluation, which microprocessor receives the output signal of the integrator stage at a first input and the output signal of the FM demodulator at a second input via an A/D converter. The microprocessor evaluates the amplitude of the signal applied to its second input only during the periods of time when the signal applied to its first input has the high amplitude.

The output signal from the integrator stage may be directly applied to the microprocessor, which can directly evaluate this signal. As soon as this signal reaches the high amplitude, it signals to the microprocessor that the FM demodulator output signal applied to its second input, via an A/D converter, is valid and that its value can be utilized to determine the field strength of that transmitter to which the FM receiver is tuned or returned.

BRIEF DESCRIPTION OF THE DRAWINGS

These and other aspects of the invention will be apparent from and will be elucidated with reference to the embodiments described hereinafter.

In the drawing.

DESCRIPTION OF THE PREFERRED EMBODIMENTS

Figure 1:
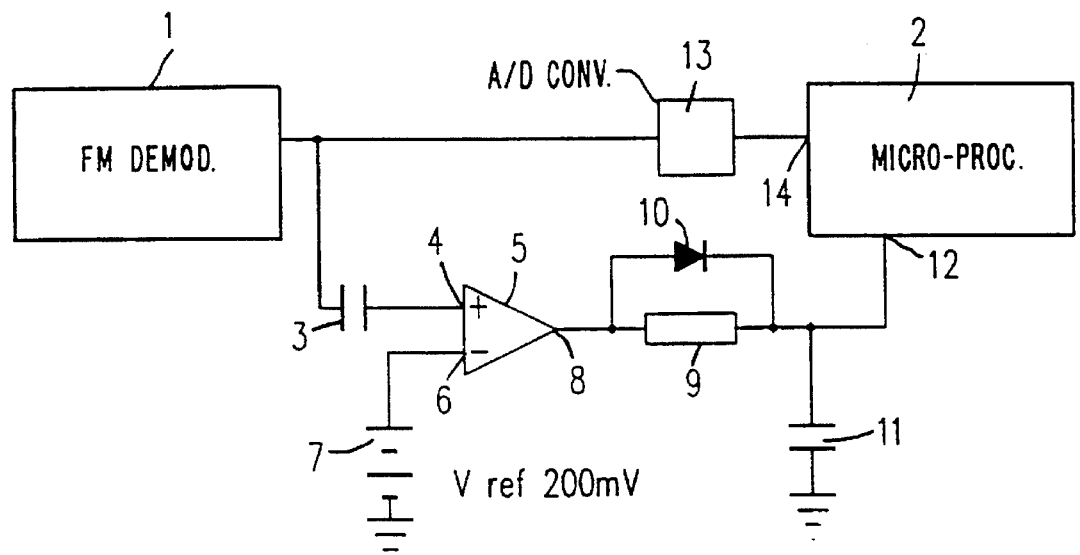
FIG. 1 is a circuit diagram of the circuit arrangement according to the invention.

A circuit arrangement for an FM receiver shown in FIG. 1 is provided for determining the field strength of FM transmitters to which the FM receiver is tuned or returned.

The FM receiver, which is not shown in FIG. 1, includes an FM demodulator 1 whose output signal is applied to an A/D converter 13 and subsequently to a second input 14 of a microprocessor denoted by the reference numeral 2 in FIG. 1. The A/D converter 13 may alternatively be integrated in the microprocessor 2.

The output signal of the FM demodulator 1 is further applied to a first input 4 of a comparator 5 via a capacitance 3. A second input 6 of the comparator 5 receives a comparison signal which is obtained from a voltage source 7, shown diagrammatically in FIG. 1.

The output signal available at an output 8 of the comparator 5 is applied to an integrator stage comprising a resistor 9, a diode 10 and a capacitance 11.

A first terminal of the resistor 9 is connected to the output 8 of the comparator 5 and supplies the output signal of the integrator stage at its second terminal. The resistor 9 is arranged in parallel with the diode 10 whose anode end is connected to the output 8 of the comparator 5. The cathode of the diode 10 as well as the second terminal of the resistor 9 are connected to a reference potential via a capacitance 11. The time constant of the integrator stage advantageously has a value of approximately 200 μs.

The output signal of the integrator stage is applied to a first input 12 of the microprocessor 2.

The operation of the circuit arrangement shown in FIG. 1 will now be described in greater detail with reference to FIG. 2.

Figure 2:
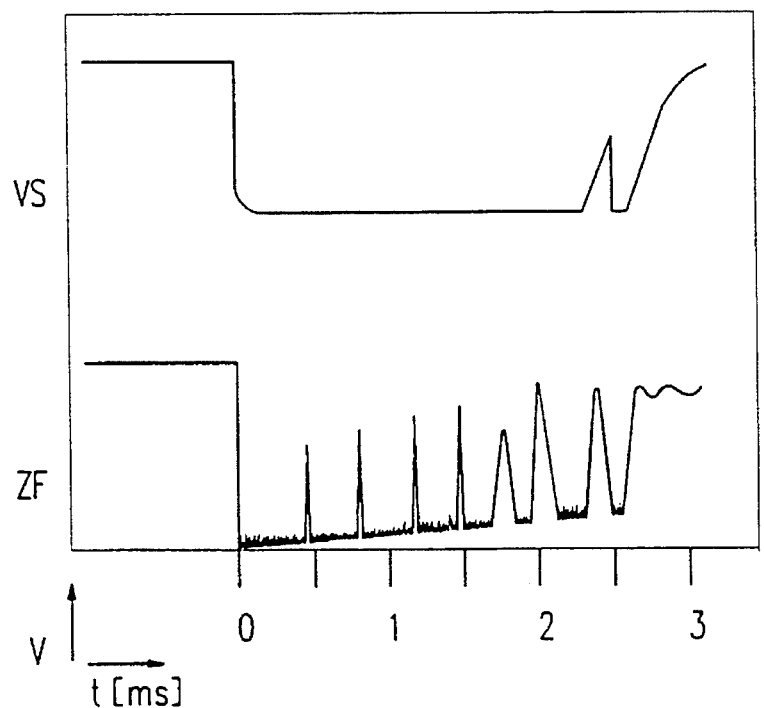
FIG. 2 shows a time diagram of two signals of the circuit arrangement of FIG. 1.

FIG. 2 shows two signal characteristic curves with respect to time. The signal shown in the lower part of FIG. 2 and denoted by ZF represents the output signal of the FM demodulator 1 of FIG. 1. The signal shown in the upper part of the Figure and denoted by VS represents the output signal of the comparator of the circuit arrangement shown in FIG. 1.

The output signal ZF in FIG. 2 has a high amplitude during the period of time when the FM receiver is initially tuned to a received first transmitter. To check the field strength of another FM transmitter, the FM receiver, which is not further shown in the Figure, is adjusted in frequency. However, this requires some time, which, as shown in FIG. 2, can be particularly recognized from the output signal ZF of the FM demodulator in that the amplitude of its output signal initially assumes heavily fluctuating values. After approximately 3 ms the output signal has become steady and can now be utilized for evaluating the field strength of the returned FM transmitter.

This is signaled to the microprocessor 2 in the circuit arrangement of FIG. 2 in such a way that the signal VS of the circuit arrangement according to the invention, which signal is also shown in FIG. 2, reaches the high amplitude value. At the instant when the FM receiver is returned to the other transmitter, this signal initially assumes a low amplitude by means of which the microprocessor 2 of the arrangement of FIG. 1 is informed that the signal ZF has non-valid values. At this instant the field strength of the retuned FM transmitter cannot be evaluated yet by means of this signal. This evaluation cannot take place until the instant when the signal VS reaches the high amplitude. In the arrangement according to FIG. 2 this instant is reached approximately 3 ms after returning to the other transmitter.

The representation with respect to time in FIG. 2 particularly shows that the field strength of the other FM transmitter can already be checked after a relatively short time. As compared with the state of the art, this is a great step forward, because the actual time required by the FM receiver to tune to the other transmitter is determined in this case. It is no longer necessary to start from a maximum frequency jump, which would require a longer response time than in the representation according to FIG. 2. The waiting time to be observed until the field strength of the newly received FM transmitter is evaluated is thus individually determined by the circuit arrangement according to the invention, while a significantly shorter waiting time is achieved particularly at frequently occurring, relatively small frequency jumps.

I claim:
1. In an FM receiver, a circuit for determining field strength of at least two FM transmitters operating at different frequencies, said circuit comprising:

an FM demodulator which produces at its output an output signal with a characteristic that indicates when the FM receiver is tuned to one or the other of said different frequencies, said output signal then having an amplitude value determined by the field strength of the FM transmitter to which the FM receiver is tuned, a comparator having a first input coupled to the output of the FM demodulator and a second input coupled to a source of reference voltage, said comparator deriving at its output a binary output signal determined by said output signal characteristic, an integrator stage having an input coupled to the output of the comparator and having an output at which is produced an activation signal only in response to said output signal characteristic of the FM demodulator, and means for evaluating signals indicative of FM transmitter field strength and which has first and second inputs coupled to the output of the FM demodulator and to the output of the integrator stage, respectively, such that said first input of the evaluating signal means receives the FM demodulator output signal without a substantial delay.

2. An FM receiver as claimed in claim 1, wherein said field strength evaluating means comprises a microprocessor arranged to provide a field strength evaluation, wherein the microprocessor receives the output signal of the integrator stage at a second input and the output signal of the FM demodulator at a first input via an A/D converter, and wherein the microprocessor evaluates the amplitude of the signal applied to its first input only during the periods of time when the signal applied to its second input has a high amplitude.

3. An FM receiver as claimed in claim 1, wherein integrator stage has a time constant of approximately 200 μs.

4. An FM receiver as claimed in claim 1 wherein the integrator stage comprises a resistor having a first terminal connected to an output of the comparator and a second terminal which supplies the integrator stage activation signal, a diode coupled in parallel with the resistor and having its anode connected to the first terminal of the resistor, and a capacitance connected at one end to the second terminal of the resistor and at the other end to a reference potential.

5. The FM receiver as claimed in claim 1 wherein the integrator stage comprises an RC circuit for smoothing voltage peaks in the output signal of the comparator.

6. The FM receiver as claimed in claim 1 wherein said signal evaluating means comprises a microprocessor and said activation signal is supplied to the second input thereof without substantial delay.

7. The FM receiver as claimed in claim 1 wherein the FM receiver evaluates Radio Data System (RDS) signals.

8. The FM receiver as claimed in claim 1 wherein said comparator and said integrator stage are coupled in cascade between the output of the FM demodulator and the second input of the signal evaluating means and are operative to produce said activation signal when the FM receiver is re-tuned from a frequency of a first one of said FM transmitters to the frequency of a second one of said FM transmitters.

\* \* \* \* \*